United States Patent [19]
Chess

[11] Patent Number: 5,914,615
[45] Date of Patent: Jun. 22, 1999

[54] METHOD OF IMPROVING THE QUALITY AND EFFICIENCY OF IDDQ TESTING

[75] Inventor: Brian Chess, Palo Alto, Calif.

[73] Assignee: Hewlett-Packard Company, Palo Alto, Calif.

[21] Appl. No.: 08/841,175

[22] Filed: Apr. 29, 1997

[51] Int. Cl.$^6$ .................................................. G01R 31/26
[52] U.S. Cl. ............................................ 324/765; 324/73.1
[58] Field of Search ................................. 324/765, 763, 324/237, 238, 73.1, 158.1; 365/201; 371/15.1, 22.1, 222, 22.6, 25.1; 438/14, 17, 18; 257/40, 48

[56] References Cited

U.S. PATENT DOCUMENTS

| | | | |
|---|---|---|---|
| 5,025,344 | 6/1991 | Maly et al. | 324/73.1 |
| 5,332,973 | 7/1994 | Brown et al. | 324/765 |
| 5,670,892 | 9/1997 | Sporck | 324/765 |

*Primary Examiner*—Vinh P. Nguyen
*Attorney, Agent, or Firm*—Brian R. Short

[57] ABSTRACT

A method of detecting defects within an integrated circuit. Iddq testing for defects within integrated circuits includes measuring the quiescent (Iddq) current conducted by power supply nodes of the integrated circuit which are connected to a power supply while controlling signal levels of a plurality of inputs to the integrated circuit. The method of this invention includes calculating an upper threshold Iddq value and a lower threshold Iddq value. The input nodes are driven to a predetermined combination of input voltages and a corresponding Iddq value is measured. It is determined whether the measured Iddq value is between the upper threshold Iddq value and the lower threshold Iddq value. Another embodiment of this invention includes the upper and lower threshold values being dependent on a measured mean value of Iddq for the integrated circuit.

5 Claims, 5 Drawing Sheets

METHOD OF IMPROVING THE QUALITY AND EFFICIENCY OF IDDQ TESTING

FIELD OF INVENTION

This invention relates generally to a method of detecting defects within an integrated circuit. In particular, it relates to a method of determining whether a defect exists within an integrated circuit by measuring and characterizing Iddq current conducted by the integrated circuit.

BACKGROUND

Complementary metal oxide silicon (CMOS) integrated circuits are popular because of their low power consumption characteristics. An ideal CMOS circuit conducts a negligible amount of current when the CMOS circuit is in standby or a quiescent state. Therefore, when a CMOS circuit is not switching states, only a small amount of quiescent current should be conducted by the CMOS circuit. The quiescent current, commonly referred to as Iddq, is composed primarily of leakage current. Iddq is the IEEE symbol for the quiescent power supply current in metal oxide silicon (MOS) circuits. A defective CMOS circuit may draw a significantly larger amount of quiescent current than a non-defective CMOS circuit.

Typically, Iddq testing includes setting a threshold value of Iddq in which the integrated circuit being tested is failed if the Iddq current conducted by the integrated circuit exceeds the threshold value. The Iddq current is measured while inputs to the integrated circuit are driven high or low depending on predetermined states of input test vectors. Iddq testing includes stepping through many different combinations of input test vectors to exercise the functionality within the integrated circuit. The test vectors can be generated by automatic test pattern generation (ATPG) software tools, or by integrated circuit designers.

FIG. 1 shows a standard CMOS gate 10 within an integrated circuit. FIG. 1 also shows the Iddq current conducted by the CMOS gate 10. FIG. 2 shows standard input (Vin) and output (Vout) waveforms of the CMOS gate 10. FIG. 2 also shows the Iddq current conducted by the CMOS gate 10 when there is a defect 21 and when there is not a defect 23.

One of the most difficult elements of Iddq testing is setting the threshold value. An integrated circuit that draws more current than the threshold value of Iddq for any input test vector is declared defective. An integrated circuit that draws less current than the threshold value of Iddq is considered good. If the threshold value is set too high, then integrated circuits that contain defects may be considered good. This decreases the quality level of the integrated circuits considered good. If the threshold value is set too low, then integrated circuits that are free of defects may fail the Iddq test. This increases the cost of the integrated circuits considered good. Therefore, the determination of the threshold value for Iddq testing involves a trade-off between the quality and the cost of the integrated circuits which pass the Iddq testing.

Process variations of the fabrication of the integrated circuits further complicate the determination of the Iddq threshold value. Process variations can affect the current drawn by the integrated circuits. Therefore, process variations can dictate increasing the threshold value of Iddq of a particular integrated circuit. However, it can be difficult to determine whether an increase in the Iddq current conducted by an integrated circuit is caused by process variations or by an increase in defects.

Gattiker and Maly (A. E. Gattiker and W. Maly, "Current Signatures", Proc. VLSI Test Symposium, PP. 112–117, 1996) have proposed a method which eliminates some of the threshold selection problems. Traditionally, testing of an integrated circuit ends as soon as the integrated circuit fails the Iddq test. Gattiker and Maly propose that Iddq values be measured for a complete set of input test vectors. A complete set of input test vectors include enough test vectors to completely exercise the functionality of the circuitry within the integrated circuit being tested. From the measured values of Iddq, a current signature is generated. The current signature includes an ordering of the Iddq measurements from the smallest value to the largest value. Gattiker and Maly claim that the magnitude of the measurements is not as important as the shape of a plot of the current signature. If there are no large jumps in the plot of the current signature, then the integrated circuit is designated as good. If the plot of the current signature include any significant jumps or discontinuities, then the integrated circuit is designated as defective.

The Iddq current signature concepts proposed by Gattiker and Maly represent important findings in Iddq current testing analysis. However, these concepts cannot be practically implemented into present-day integrated circuit manufacturing environments. Testing methods using the Gattiker and Maly Iddq current signature concepts require a complete set of input vector test settings to be applied to the integrated circuit under test and the resultant measured values of Iddq current for each input vector test setting to be analyzed. In an integrated circuit manufacturing environment, testing of the integrated circuits must be extremely fast. Additional testing and analysis steps slow down the speed of producing shippable integrated circuits which increases the cost of the integrated circuits.

It is desirable to have a method of Iddq testing which overcomes the limitations of the present single Iddq current threshold comparison tests. Furthermore, it is desirable that the method of Iddq testing be easily implemented into existing integrated circuit manufacturing environments by not requiring excessive storage and analysis of measured values of Iddq.

SUMMARY OF THE INVENTION

The present invention is a method of Iddq testing which is more efficient than presently existing methods of Iddq testing. The method includes determining an upper threshold value of Iddq current and a lower threshold value of Iddq current.

A first embodiment of this invention includes a method for detecting defects within an integrated circuit. A power supply node of the integrated circuit is connected to a power supply and the power supply node conducts a quiescent current of Iddq. The integrated circuit further includes a plurality of input nodes. The method of detecting defects includes calculating an upper threshold Iddq value and a lower threshold Iddq value. The input nodes are driven to a predetermined combination of input voltages and a corresponding Iddq value is measured. Finally, it is determined whether the measured Iddq value exceeds the upper threshold Iddq value or is less than the lower threshold Iddq value.

Another embodiment of the invention is similar to the first embodiment, but includes the upper and the lower threshold values being calculated from a measured mean value of Iddq current conducted by the integrated circuit.

Other aspects and advantages of the present invention will become apparent from the following detailed description,

DETAILED DESCRIPTION

Figure 1:
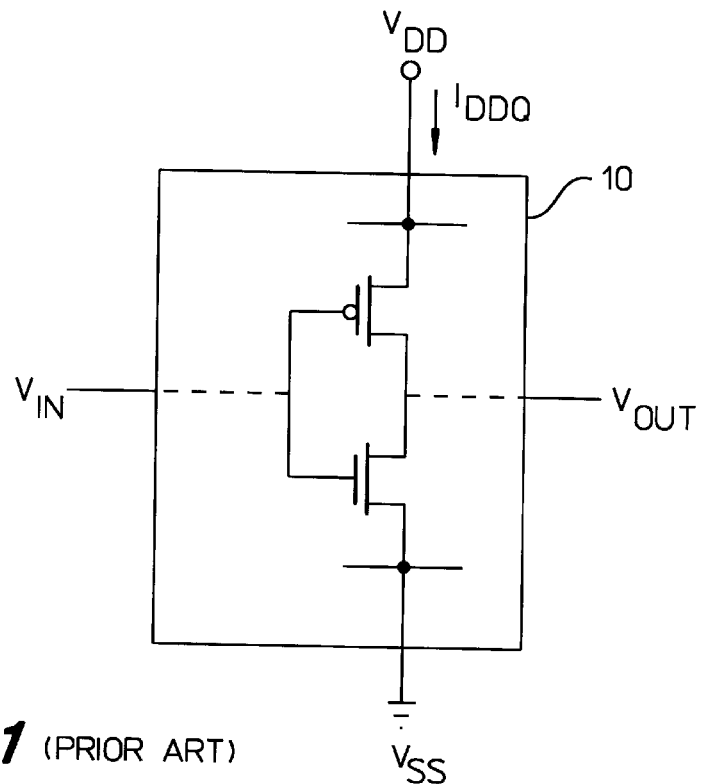
FIG. 1 shows a CMOS inverter circuit.
Figure 2:
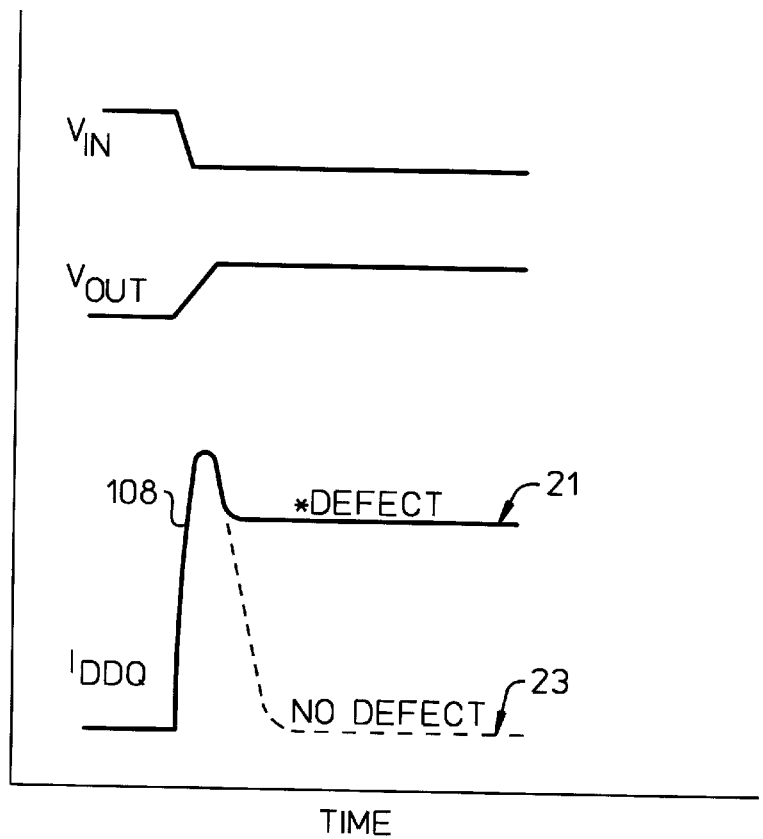
FIG. 2 is a plot of measured Iddq for a defective CMOS circuit and a defect-free CMOS circuit.
Figure 3:
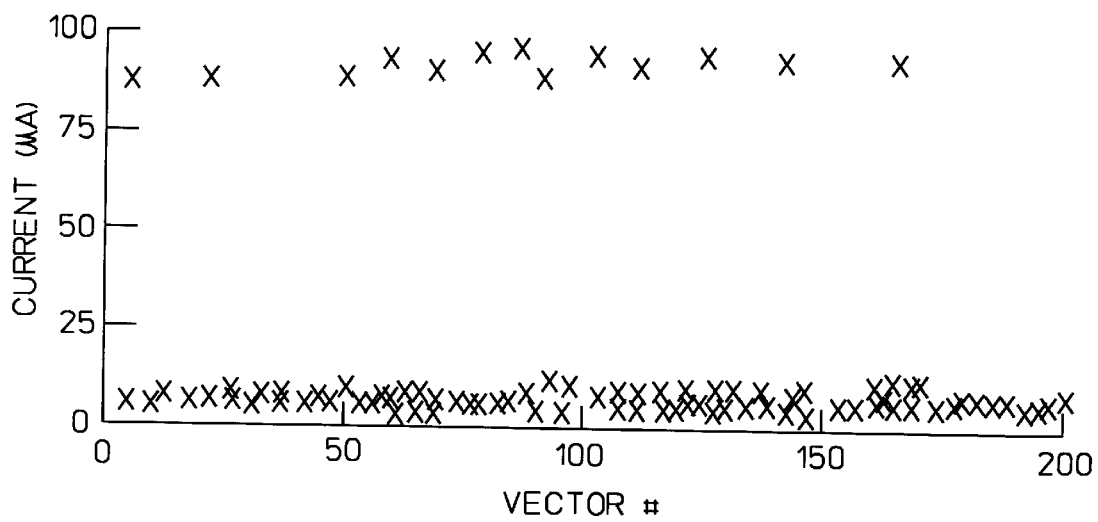
FIG. 3 is a plot of Iddq values for many different input test vectors driving the inputs to a single circuit.
Figure 4:
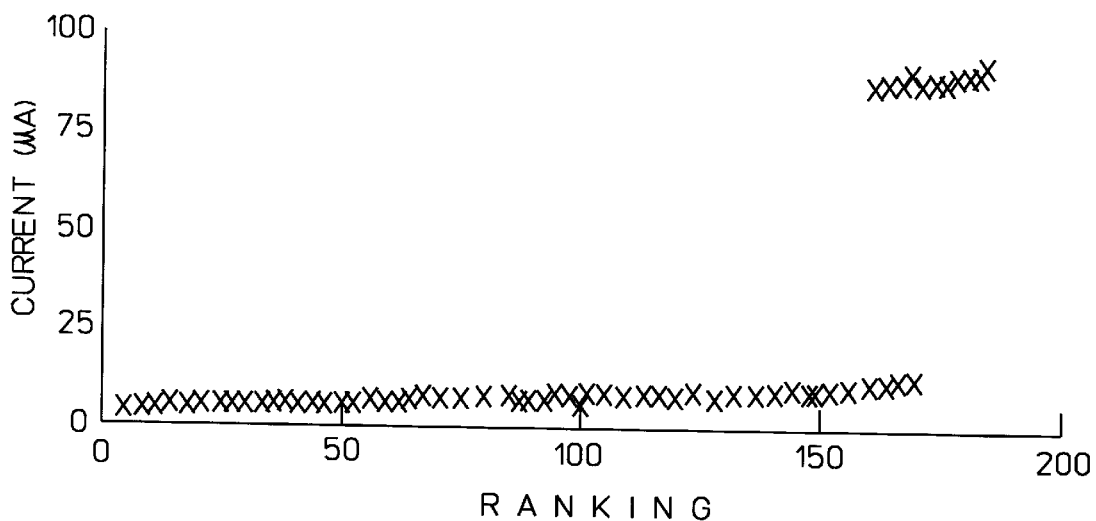
FIG. 4 is a plot of the Iddq values of FIG. 3 ordered from smallest to largest.

As shown in the drawings for purposes of illustration, the invention is embodied in a method for detecting defects within an integrated circuit. The method includes determining an upper Iddq threshold and a lower Iddq threshold for the integrated circuit. The method further includes measuring the Iddq current conducted by the integrated circuit. If the measured value of Iddq current is greater than the upper Iddq threshold or is less than the lower Iddq threshold then the integrated circuit is failed.

Upper and lower threshold values are generated for each individually tested integrated circuit. Generation of the upper and lower thresholds for a particular integrated circuit is accomplished by first determining a mean Iddq current value for the integrated circuit. The upper and lower threshold values are calculated from the mean Iddq current value by adding a first offset value to the mean Iddq current value to obtain the upper threshold value and subtracting a second offset value from the mean Iddq current value to obtain the lower threshold value. Unlike present methods of Iddq testing which set a single threshold, the thresholds values are unique to each integrated circuit tested. Therefore, process variations in the fabrication of the integrated circuit which can cause variations in the Iddq current conducted by the integrated circuit are indirectly factored into the calculations of the upper and lower thresholds.

The mean Iddq current value for each integrated circuit is obtained by averaging several Iddq current measurements of the particular integrated circuit. Each measured value of Iddq corresponds to a different combination of input test vectors. The test vectors can be generated by automatic test pattern generation software tools, or the test vectors can be selected by an integrated circuit test operator. The number of measured values of Iddq must be enough to create a statistically significant value. Once the mean Iddq current value has been calculated, the upper and lower thresholds can be generated.

The first and second offset values are determined through both CAD simulation of the integrated circuit design and experimental testing of the integrated circuit design. Large scale integrated circuits are typically designed through the use of CAD simulations. The CAD simulations can be used to obtain a first approximation of the expected range of Iddq current that the integrated circuit will conduct. The Iddq current conducted by an integrated circuit will depend upon the number of transistors to be fabricated on the integrated circuit and the type of process used to fabricate the integrated circuit. A larger number of transistors will increase the Iddq current.

CAD simulation can provide a first approximation of the expected range of Iddq values. However, typically the Iddq approximations must be slightly modified. The amount of Iddq current conducted by actual circuits must be measured to verify the accuracy of the approximated Iddq current values. Deviations between the measured and approximated value must be used to modify the approximated values.

The Iddq current of a particular integrated circuit design will also vary between different lots of fabricated integrated circuits. A lot is typically defined as five wafers. Several different lots of integrated circuits should be tested for determination of the expected range of Iddq values.

Figure 5:
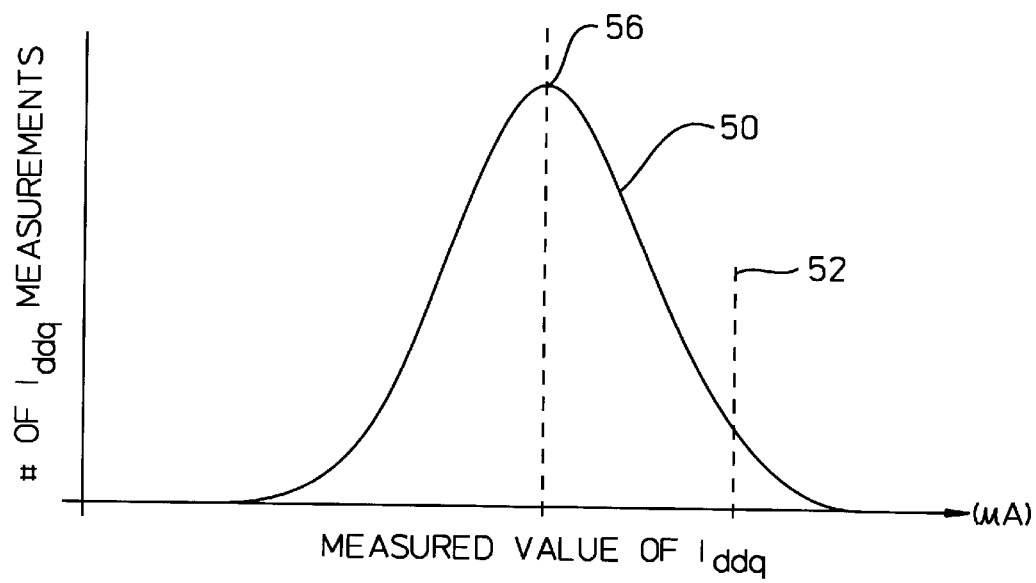
FIG. 5 shows a distribution of measure values of Iddq for many input test vectors and many different integrated circuits.

FIG. 5 is a plot which shows a distribution of Iddq measured values for many integrated circuits in which each of the integrated circuits have the same electrical circuit elements. The Iddq measurements are taken from the Iddq current conducted by many different integrated circuits in which many different input test vectors drive inputs to the integrated circuits. Furthermore, the integrated circuits are fabricated from several different lots of wafers. The distribution is depicted by a curve 50. The curve 50 includes a mean value 56 which is generally the maximum point of the curve 50. The mean value 56 can be equal to the mean value of the curve 50.

An embodiment of the invention includes the first offset value and the second offset value being equal. FIG. 5 shows an offset Iddq current value 52 on the curve 50 which may be used to determine the first and second offset values. For this embodiment, the offset Iddq current value 52 is two standard deviations of the Iddq current values which form the curve 50 above the mean value 56. The first and second offset values are equal to the difference between the mean value 56 and the offset Iddq current value 52.

The selection of the offset Iddq current value 52 is based upon a judgement of what measured values of Iddq current indicate a defective or a defect-free integrated circuit. The selection of the offset Iddq current value 52 includes balancing between passing defective integrated circuits and failing defect free integrated circuits. That is, if the offset Iddq current value 52 is too high, then defective-free integrated circuits will fail the Iddq testing of the invention. If the offset Iddq current value 52 is too low, then defective integrated circuits will pass the Iddq testing of the invention. Therefore, selection of the offset Iddq current value 52 includes a trade-off between the quality and the quantity of integrated circuits which pass the Iddq testing of the invention. A typical first or second offset value may be 23 uA.

An embodiment of the invention includes determining the mean Iddq measured value of an integrated circuit under test. For example, Iddq can be measured for eight different predetermined test vectors. The eight measured values can be averaged to determine the mean value. A typical value of the mean value for a defect-free integrated circuit is 5 uA. An upper threshold is calculated by adding the first offset to the Iddq mean measured value. A lower threshold is calculated by subtracting the second offset from the Iddq mean measured value. Assuming that the first offset and the second offset are 23 uA, then the lower threshold for a typical defect-free integrated circuit will be about −18 uA and the upper threshold for the defect-free integrated circuit will be about 28 uA. The measured values of Iddq will never be less than zero. Therefore, the typical defect-free integrated circuit will never generate an Iddq measurement less than the lower threshold value. Other integrated circuits which have a mean Iddq measured value which is greater than the typical value, can have a positive lower threshold value. If the measure mean Iddq value is greater than the expected or estimated mean value, then the values of the first and second offsets may be proportionately increased. If the measure mean Iddq value is less than the expected or estimated mean value, then the values of the first and second offsets may be proportionately decreased.

After the upper and lower thresholds have been calculated for the integrated circuit being tested, several predetermined input vectors drive the inputs to the integrated circuit to several different states. For each state, the Iddq current of the integrated circuit is measured. If any of the Iddq measurement are less than the lower threshold or greater than the upper threshold, then the integrated circuit fails the Iddq testing of the invention.

Figure 6:
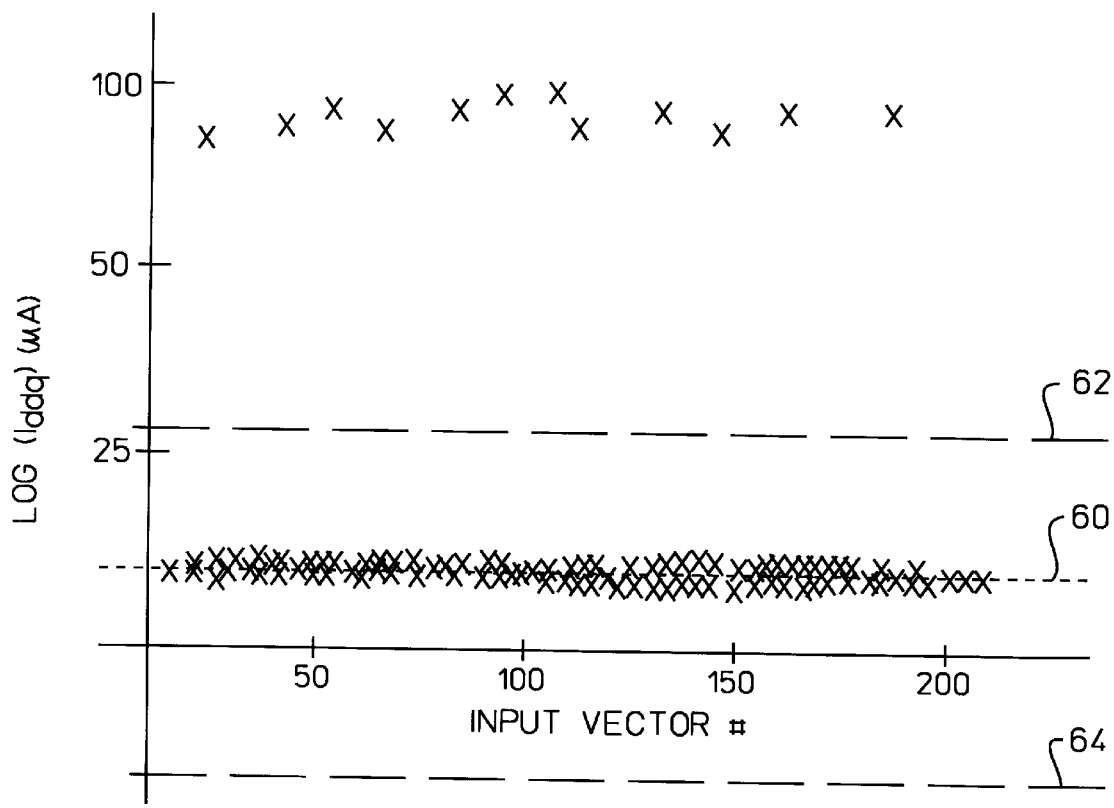
FIG. 6 is a plot of measured Iddq values for many different input test vectors which depicts the upper and lower thresholds which the measured Iddq values must fall between for the tested integrated circuit to pass the method of defect testing of the invention.
Figure 7:
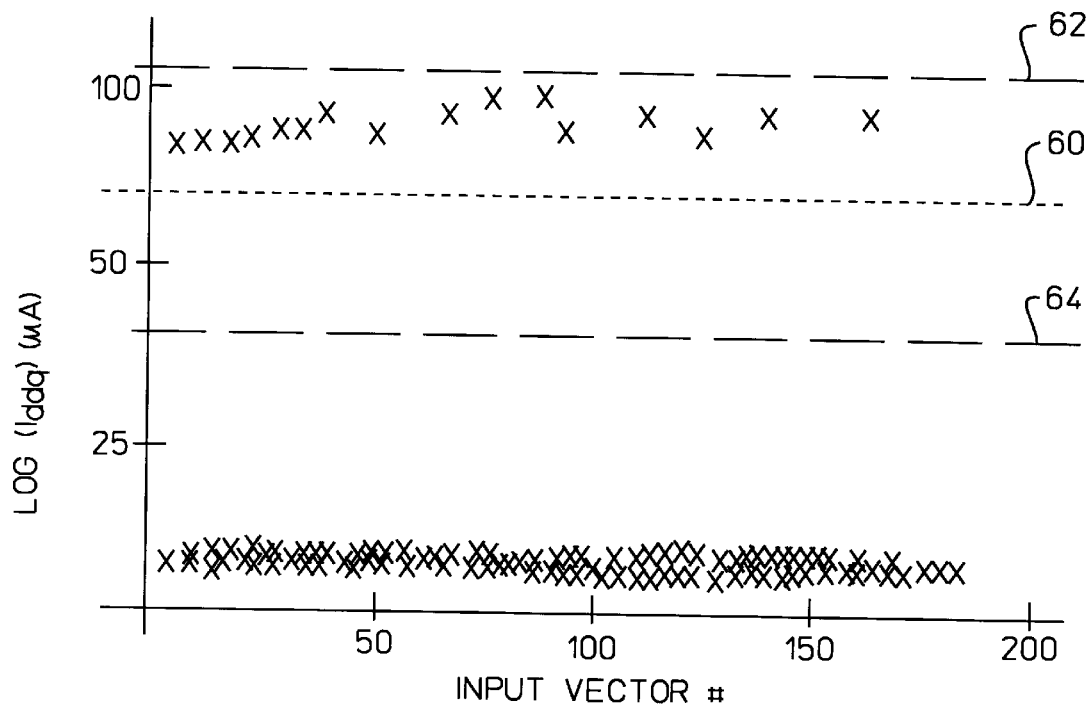
FIG. 7 is another plot of measured Iddq values for many different input test vectors which depicts the upper and lower thresholds which the measured Iddq values must fall between for the tested integrated circuit to pass the method of defect testing of the invention.
Figure 8:
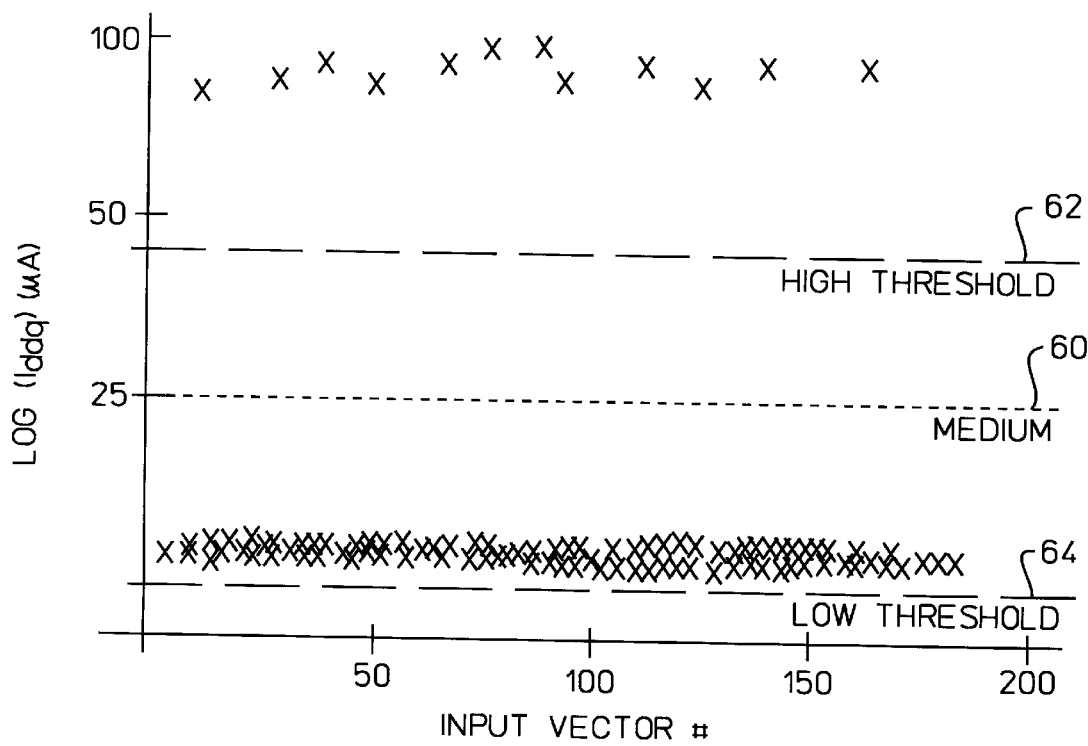
FIG. 8 is another plot of measured Iddq values for many different input test vectors which depicts the upper and lower thresholds which the measured Iddq values must fall between for the tested integrated circuit to pass the method of defect testing of the invention.

FIG. 6, FIG. 7 and FIG. 8 show measure values of Iddq for defective integrated circuits. The mean Iddq value is determined by averaging the first eight measured values. The first eight measured Iddq values correspond to eight predetermined input test vectors.

FIG. 6 is a plot that depicts the Iddq measurements of a defective integrated circuit. The plot includes the mean Iddq value 60, the upper threshold 62 and the lower threshold 64. The mean Iddq value 60 is about 5 uA, the upper threshold 62 is about 28 uA and the lower threshold 64 is about −18 uA. Several of the Iddq measurements of the integrated circuit are greater than the upper threshold 62. Therefore, the integrated circuit fails the Iddq testing of the invention.

FIG. 7 is a plot that depicts the Iddq measurements of a defective integrated circuit. The plot includes the mean Iddq value 60, the upper threshold 62 and the lower threshold 64. The mean Iddq value 60 is about 70 uA, the upper threshold 62 is about 102 uA and the lower threshold is about 38 uA. Several of the Iddq measurements of the integrated circuit are less than the lower threshold 64. Therefore, the integrated circuit fails the Iddq testing of the invention. The first and second offsets for this embodiment are 32 uA. As previously mentioned, the first and second offsets may be scaled up if the mean Iddq value is greater than expected.

FIG. 8 is a plot that depicts the Iddq measurements of a defective integrated circuit. The plot includes the mean Iddq value 60, the upper threshold 62 and the lower threshold 64. The mean Iddq value 60 is about 25 uA, the upper threshold 62 is about 48 uA and the lower threshold is about 2 uA. Several of the Iddq measurements of the integrated circuit are greater than the upper threshold 62. Therefore, the integrated circuit fails the Iddq testing of the invention.

Figure 9:
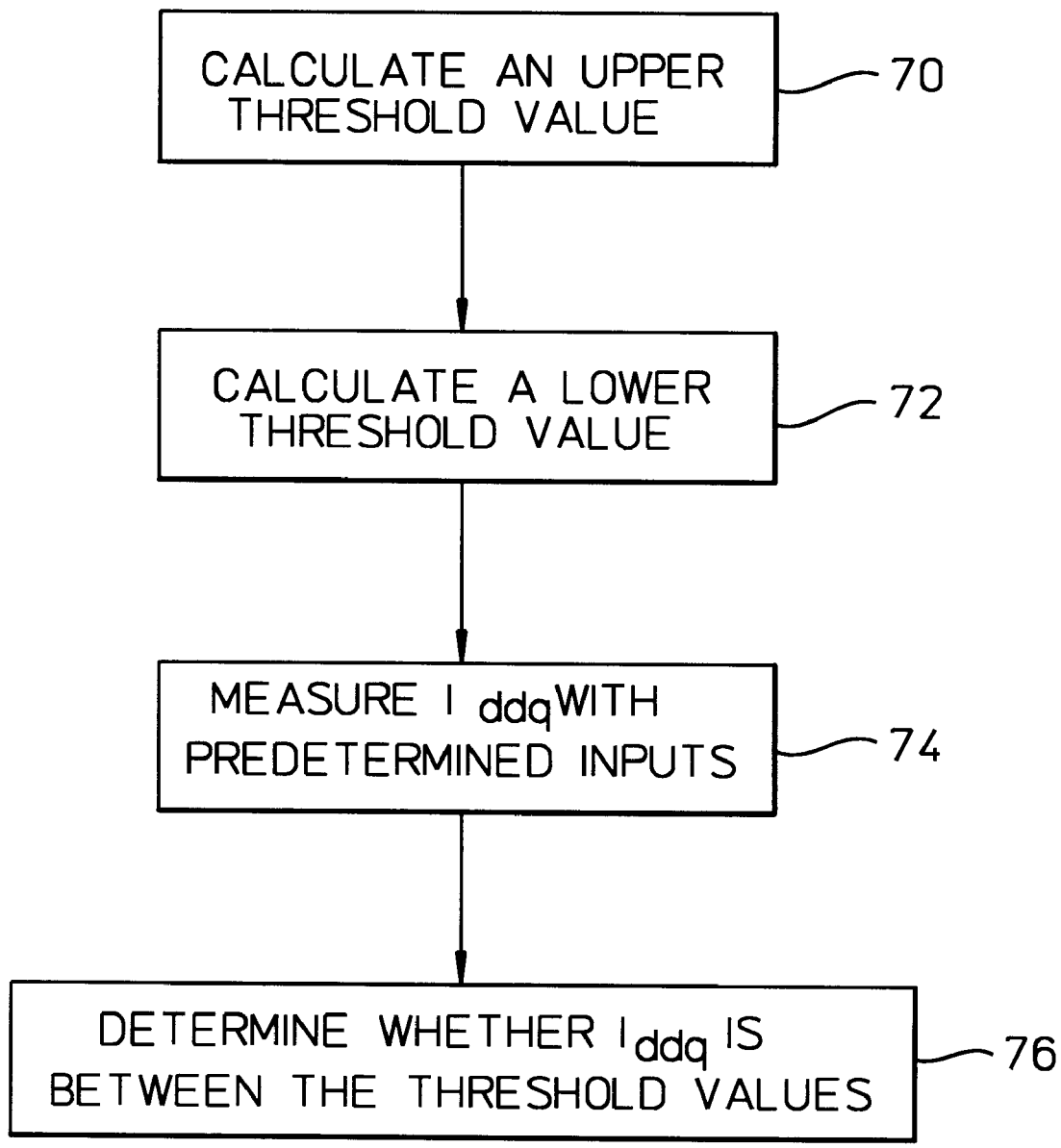
FIG. 9 is a flow chart of the steps included within an embodiment of this invention.

FIG. 9 is a flow chart depicting the method of the invention for Iddq testing for defects within an integrated circuit. A first step 70 includes calculating an upper threshold. A second step 72 includes calculating a lower threshold. A third step 74 includes measuring the Iddq current conducted by the integrated circuit being tested while inputs to the integrated circuit are driven by several predetermined test vectors. A final step 76 includes failing the integrated circuit if any of the measured Iddq values are greater than the upper threshold or less than the lower threshold.

This invention requires minimal computations. Therefore, unlike the current signature tests, minimal computer resources are required to implement the invention. The upper and lower threshold can be calculated. Iddq measurements are made until a measured Iddq value is less than the lower threshold or greater than the upper threshold. The integrated circuit being tested is failed if the value of an Iddq measurement is not between the lower threshold and the upper threshold.

If many Iddq measurements are to be made, then the Iddq current can be measured with a current sensor which is not included with conventional Iddq testers. The current sensor can be optimized for rapid measurements. Measurement accuracy may be sacrificed for measurement speed. Furthermore, the sensors can include a small amount of additional circuitry which provides detection of Iddq measurements less than the lower threshold or greater than the upper threshold. This current sensor configuration allows the Iddq testing of the invention to be incorporated into present integrated circuit testers without requiring any modifications to the testers.

Although specific embodiments of the invention have been described and illustrated, the invention is not to be limited to the specific forms or arrangements of parts so described and illustrated. The invention is limited only by the claims.

What is claimed is:

1. A method for detect defects within an integrated circuit, the integrated circuit having a power supply node connected to a power supply, the power supply node conducting a quiescent current of Iddq, the integrated circuit having a plurality of input nodes, the method comprising:

a. calculating an upper threshold Iddq value;

b. calculating a lower threshold Iddq value;

c. measuring a measured Iddq value, the measured Iddq value corresponding to the input nodes being driven to a unique combination of input voltages;

d. detecting whether the measured Iddq value exceeds the upper threshold Iddq value; and e. detecting whether the measured Iddq values is less than the lower threshold Iddq value.

2. The method for detect defects within an integrated circuit as recited in claim 1, wherein the step of determining an upper threshold Iddq value comprises:

measuring a mean value of Iddq current conducted by the integrated circuit; and calculating the upper threshold by adding a first offset to the mean value of Iddq current.

3. The method for detect defects within an integrated circuit as recited in claim 2, wherein the first offset is estimated by characterizing the Iddq current conducted by several integrated circuits.

4. The method for detect defects within an integrated circuit as recited in claim 1, wherein the step of determining a lower threshold Iddq value comprises:

measuring a mean value of Iddq current conducted by the integrated circuit; and calculating the lower threshold by subtracting a second offset from the mean value of Iddq current.

5. The method for detect defects within an integrated circuit as recited in claim 4, wherein the second offset is characterizing the Iddq current conducted by several integrated circuits.

\* \* \* \* \*